United States Patent

Ding et al.

(10) Patent No.: US 9,256,014 B2
(45) Date of Patent: Feb. 9, 2016

(54) FABRICATION OF A MICRO-OPTICS DEVICE WITH CURVED SURFACE DEFECTS

(71) Applicant: International Business Machines Corporation, Armonk, NY (US)

(72) Inventors: Fei Ding, Rueschlikon (CH); Urs T. Duerig, Rueschlikon (CH); Armin W. Knoll, Rueschlikon (CH); Rainer F. Mahrt, Rueschlikon (CH); Thilo H. Stoeferle, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 506 days.

(21) Appl. No.: 13/792,504

(22) Filed: Mar. 11, 2013

(65) Prior Publication Data

US 2013/0258478 A1    Oct. 3, 2013

(30) Foreign Application Priority Data

Mar. 29, 2012 (GB) .................................. 1205552.1

(51) Int. Cl.
*G02B 5/28* (2006.01)
*H01S 5/183* (2006.01)

(52) U.S. Cl.
CPC ............. *G02B 5/284* (2013.01); *H01S 5/18388* (2013.01); *H01S 5/18391* (2013.01); *Y10T 428/24736* (2015.01)

(58) Field of Classification Search
CPC ........................................................ G02B 5/284
USPC .................................................. 427/162–169
See application file for complete search history.

(56) References Cited

U.S. PATENT DOCUMENTS

| 6,325,850 | B1 | 12/2001 | Beaumont |
| 6,711,200 | B1 | 3/2004 | Scherer et al. |
| 6,980,577 | B1 | 12/2005 | Francis et al. |
| 7,729,043 | B2 | 6/2010 | El Daif et al. |

(Continued)

FOREIGN PATENT DOCUMENTS

| CN | 1716720 A | 1/2006 |
| CN | 102265218 A | 11/2011 |

(Continued)

OTHER PUBLICATIONS

Painter O., et al., "Two-Dimensional Photonic Band-Gap Defect Mode Laser," Science, Jun. 11, 1999, vol. 284, pp. 1819-1821, ISSN 0036-8075.

(Continued)

*Primary Examiner* — Elizabeth Burkhart
(74) *Attorney, Agent, or Firm* — Cantor Colburn LLP

(57) ABSTRACT

A method of fabrication of a micro-optics device included providing a layer of material; patterning the layer of material by one or more of: locally unzipping and desorbing molecules thereof, with a nano-scale dimensioned probe, to obtain a curved surface for the layer of material, the curved surface having a curved profile in a plane section; and completing a layer structure perpendicular to the plane section by providing one or more additional layers of material in contact with the curved surface to obtain the micro-optics device, wherein the micro-optics device has the layer structure, with a given layer thereof comprising a defect delimited by two surfaces, wherein one of the two surfaces is the curved surface.

18 Claims, 6 Drawing Sheets

(56) References Cited

U.S. PATENT DOCUMENTS

| | | | |
|---|---|---|---|
| 2002/0131464 A1* | 9/2002 | Sirbu | B82Y 20/00 372/45.01 |
| 2002/0163688 A1 | 11/2002 | Zhu et al. | |
| 2005/0156183 A1 | 7/2005 | Tsai et al. | |
| 2005/0286597 A1 | 12/2005 | Mukoyama et al. | |
| 2006/0091322 A1 | 5/2006 | Despont et al. | |
| 2007/0201797 A1 | 8/2007 | Grzybowski et al. | |
| 2010/0196661 A1* | 8/2010 | Duerig | B82Y 10/00 428/141 |
| 2012/0082944 A1* | 4/2012 | Coady | G03F 7/0002 430/326 |
| 2012/0255073 A1* | 10/2012 | Despont | B82Y 10/00 850/57 |

FOREIGN PATENT DOCUMENTS

| | | |
|---|---|---|
| EP | 0723322 A2 | 7/1996 |
| WO | 0191855 A1 | 12/2001 |
| WO | 2010086773 A1 | 8/2010 |
| WO | 2010143163 A1 | 12/2010 |
| WO | 2011045753 A1 | 4/2011 |

OTHER PUBLICATIONS

PCT International Search Report and Written Opinion, International Application No. PCT/IB2013/051733; International Filing Date: Mar. 5, 2013; Date of Mailing: Aug. 1, 2013; pp. 1-12.

J. J. Baumberg, et al., "Parametric oscillation in a vertical microcavity: A polariton condensate or micro-optical parametric oscillation" Physical Review, B. Condensed Matter, American Institute of Physics. New York, US, vol. 62, No. 24, Dec. 15, 2000, pp. 16247-16250.

United Kingdom Limited; Search Report Under Section 17(5); Application No. GB1205552.1; Date Mailed: Aug. 21, 2012; pp. 1-4.

R.M. Nyffenegger and R.M. Penner, "Nanometer-Scale Surface Modification Using the Scanning Probe Microscope: Progress Since 1991," Chem. Rev., vol. 97, No. 4, 1997, pp. 1195-1230.

Balili R B et al: "Actively tuned and spatially trapped polaritons" Applied Physics Letters AIP USA, vol. 88, No. 3, Jan. 16, 2006, pp. 1-4.

O. El Daif, et al.,"Polariton Quantum Boxes in Semiconductor Microcavities," Appl. Phys. Lett. 88, 061105 (2006), pp. 1-4.

G. Dasbach, et al.,"Parametric polariton scattering in microresonators with three-dimensional optical confinement" Physical Review B (Condensed Matter and Materials Physics) APS Through AIP USA, vol. 64, No. 20, Oct. 26, 2001, pp. 1-4.

G. Dasbach, et al.,"Polarization inversion via parametric scattering in quasi-one-dimensional microcavities" Physical Review B (Condensed Matter and Materials Physics) APS Through AIP USA, vol. 71, No. 16, Apr. 15, 2005, pp. 1-4.

United Kingdom Limited; Search Report Under Section 17(5); Application No: GB1205550.5; Date Mailed: Aug. 21, 2012; pp. 1-3.

D. Lu, et al., "All-epitaxial mode-confined vertical-cavity surface-emitting laser" Applied Physics Letters AIP USA, vol. 85, No. 12, Sep. 20, 2004, pp. 2169-2171.

D. Lu, et al., "All-Epitaxial Mode- and Current-Confined GaAs-Based Vertical-Cavity Surface-Emitting Lasers," Dissertation—University of Texas, Dec. 2005, pp. 1-90.

Pierre Lugan, et al,"Theory of trapped polaritons in patterned microcavities" Proceedings of the 8th International Conference on Nonlinear Optics and Excitations Kinetics in Semiconductors (NOEKS-8), Feb. 20, 2006; pp. 1-4.

S. Reitzenstein, et al., "AlAs/GaAs Micropillar Cavities with Quality Factors Exceeding 150.000," Appl. Phys. Lett., 90, 251109, 2007, pp. 1-4.

PCT International Search Report and Written Opinion; International Application No. PCT/IB2013/051737; International Filing Date: Mar. 5, 2013; Date of Mailing: Aug. 1, 2013; pp. 1-12.

* cited by examiner

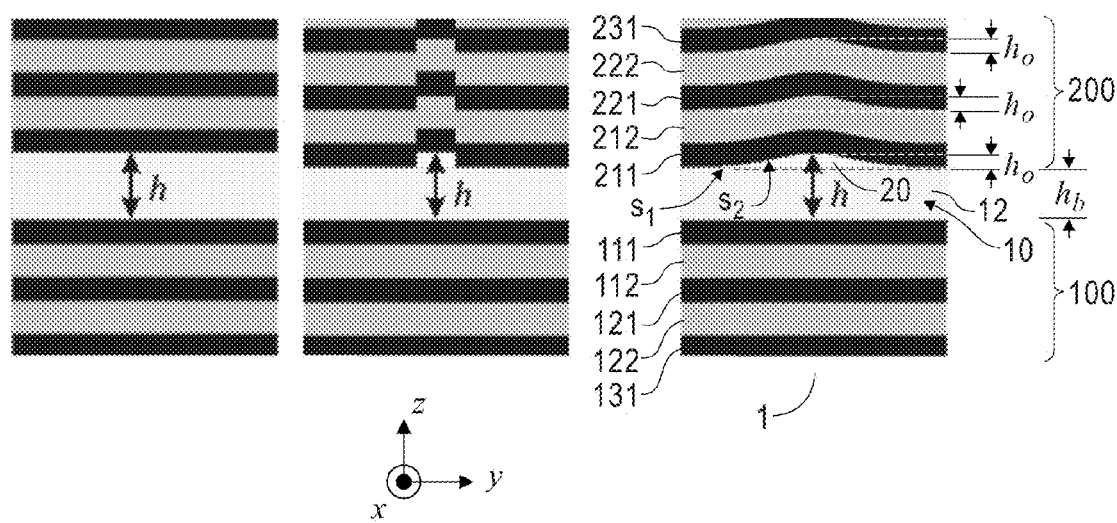
FIG. 1A
Prior Art
FIG. 1B
FIG. 1C
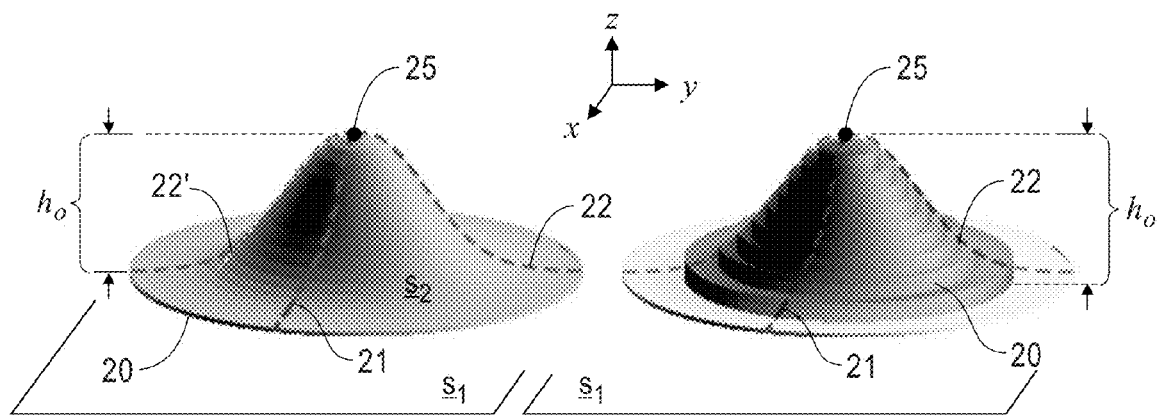
FIG. 2A
FIG. 2B

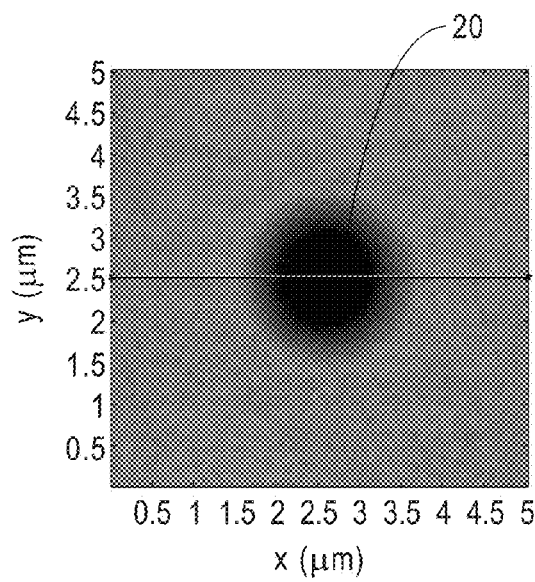
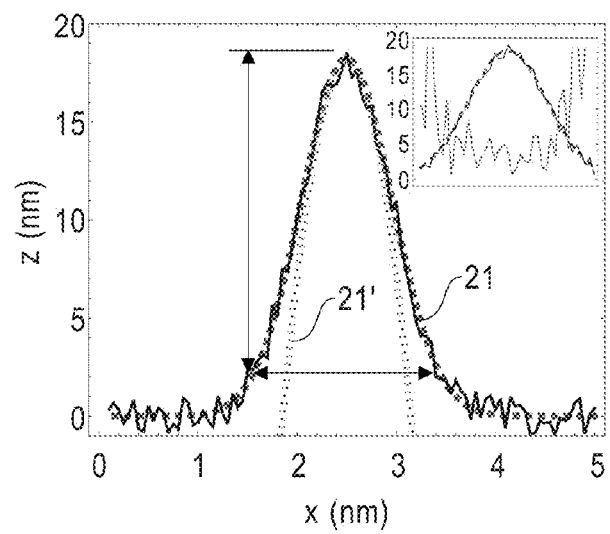
FIG. 3A　　　　　　　　FIG. 3B
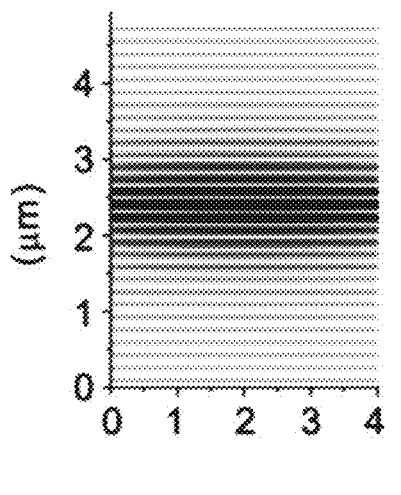
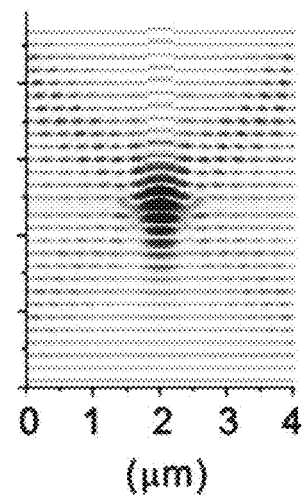
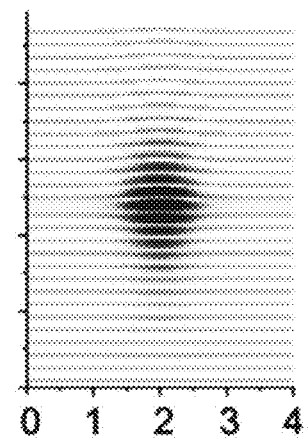
FIG. 4A　　　　　FIG. 4B　　　　　FIG. 4C

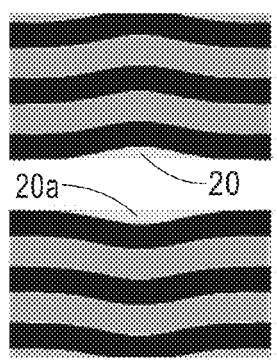 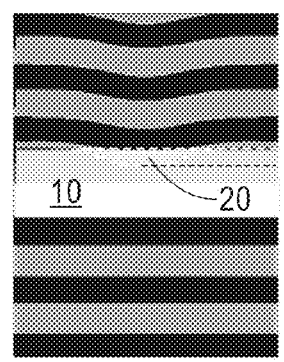 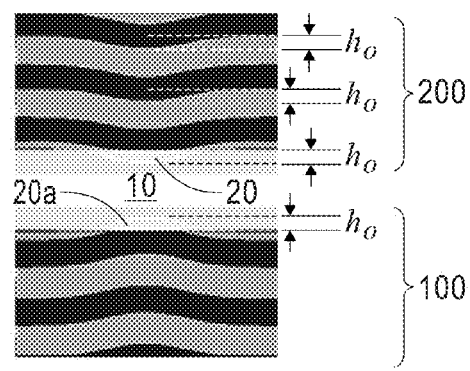
FIG. 11A  FIG. 11B  FIG. 11C

FABRICATION OF A MICRO-OPTICS DEVICE WITH CURVED SURFACE DEFECTS

PRIORITY

This application claims priority to Great Britain Patent Application No. 1205552.1, filed Mar. 29, 2012, and all the benefits accruing therefrom under 35 U.S.C. §119, the contents of which in its entirety are herein incorporated by reference.

BACKGROUND

The invention generally relates to methods of fabrication of micro-optics devices such as vertical microcavities. More particularly, it concerns methods of fabrication of micro-optics with embedded defects for enhancing electromagnetic wave confinement.

Micro-optics devices such as optical microcavities are known to confine light to a small volume. Devices using optical microcavities are today essential in many fields, ranging from optoelectronics to quantum information. Typical applications are long-distance data transmission over optical fibers and read/write laser beams in DVD/CD players. A variety of confining semiconductor microstructures has been developed and studied, involving various geometrical and resonant properties. A "microcavity" (hereafter MC) has smaller dimensions than a conventional optical cavity; its dimensions are often only a few micrometers and it may comprise parts that can even reach the nanometer range. Such dimensions notably allow for studying and harnessing quantum effects of electromagnetic fields.

More specifically, a Fabry-Perot-like cavity or a MC forms an optical cavity or resonator, which allows for a standing wave to form inside the spacer layer. The thickness of the latter determines the "cavity-modes", which correspond to the wavelengths and field distributions that can be transmitted and forms as standing wave inside the resonator. An ideal cavity would confine light indefinitely (that is, without loss) and would have resonant frequencies at defined values. The deviations from this ideal paradigm are either intentional (e.g., outcoupling) or due to design or fabrication related limitations or imperfections (e.g., scattering). They are captured by the cavity Q factor, which is proportional to the confinement time in units of the optical period. Another important descriptive parameter is the effective mode volume (V), which relates to the number of optical modes present in the cavity. In general, the realization of practical devices requires maximizing the ratio Q/V, i.e., high values for Q and low values for V are important to increase light-matter interactions in processes such as spontaneous emission, nonlinear optical processes and strong coupling.

The quality factor or Q factor is a dimensionless parameter that describes how under-damped an oscillator or resonator is. The value of Q is usually defined as $2\pi \times$ the total energy stored in the structure, divided by the energy lost in a single oscillation cycle. In optics, and more generally for high values of Q, the following definition can be retained:

$$Q = \frac{f_r}{\Delta f} = \frac{\omega_r}{\Delta \omega}. \quad (1)$$

where $f_r$ is the resonant frequency, $\Delta f$ is the bandwidth, $\omega_r = 2\pi f_r$ is the angular resonant frequency, and $\Delta\omega$ is the angular bandwidth. A cavity providing a larger Q confines the photons for a longer time.

The definition of the effective mode volume is, in the literature, usually inspired from Purcell effect calculations, giving rise to:

$$V_{\textit{eff}} = \frac{\int \varepsilon(r)|E(r)|^2 dr^3}{\varepsilon(r_{max})\max(|E(r)|^2)}, \quad (2)$$

where:
$\in(r)$ is the dielectric constant as a function of the spatial coordinate r,
$r_{max}$ is the location of the maximum squared electric field,
$|E(r)|$ is the electric field strength at the spatial coordinate r, and
V is a quantization volume encompassing the resonator and with a boundary in the radiation zone of the cavity mode under study.

Eq. (2) gives the spatial intensity enhancement factor at the point of maximum electric field intensity inside a 3D structure. However, in some cases it is more important to estimate the mode distribution or "light-confining" ability of a structure. Thus, simulations in a 2D domain may be adequate in this case. The modal volume would then be obtained by integrating over the relevant 2D surface, as provided e.g., by the Software "Meep" (or MEEP), i.e., a finite-difference time-domain (FDTD) simulation software package to model electromagnetic systems. The resulting value of V does accordingly not compare directly with values as usually reported in the literature with 3D calculation. It is nonetheless sufficient, together with the electric field pattern, for comparing the light confining abilities of simulated structures. On the contrary, Q remains as defined in Eq. (1).

A strong confinement of photons in an ultra-small cavity (with dimensions of the order of optical wavelengths) is important for the development of nanophotonic applications, such as single-photon sources, ultralow-threshold (polariton) lasers, optical filters and optical switch.

As indicated above, Q determines how long photons can be confined in a cavity. In the weak light-matter coupling regime, the spontaneous emission rate of the emitter inside a cavity is enhanced by the Purcell effect, whereby Q/V is to be maximized. On the other hand, in the strong light-matter coupling regime, the value of $Q/V^{1/2}$ is to be maximized, which is closely related to the ratio Q/V. Therefore, as a general rule, the value of Q/V is an important measure of the light confinement ability of a cavity.

Next, beyond Q and V, other issues to consider for the fabrication of microcavities are the fabrication complexity, structure tolerance, incorporation of active (quantum) emitters, in-coupling and out-coupling of light, and practicality of electrical contacting. For devices such as studied here, the conventional technology of vertical-cavity surface-emitting laser, or VCSEL, can be used. For other microcavities, other contact methods are known per se.

In vertical microcavity structures, there are essentially two ways of achieving lateral confinement, either by realizing a micropost (or micropillar) or a lateral aperture. Such structures usually offer small cavity volume and relatively high Q. They have emission patterns that particularly suited for coupling emitted photons, e.g., with optical fibers. They can further incorporate quasi-atomic quantum dots as emitters. Typically, in such structures, a confinement region is comprised between two mirrors, such as to provide one dimension (vertical) of cavity confinement. The lateral (in-plane) confinement is provided by air-dielectric guiding by total internal reflection (in the case of a micropost) or by a metal or oxide aperture. The minors consist of distributed Bragg reflectors (or DBRs), i.e., structures which are formed from multiple layers of alternating materials (layer pairs) with varying refractive index or by periodic variation of some dimensional characteristics (e.g., the height) of a dielectric waveguide, resulting in periodic variation in the effective refractive index in the guide. Each layer boundary causes a partial reflection of an optical wave.

There are different means of fabricating MCs. A common method of fabrication consists of evaporating alternate layers of dielectric media to form the mirrors and the medium inside the spacer layer, e.g., using molecular beam epitaxy (MBE).

In order to reduce the mode volume of a vertical MC, the usual approach consists of etching a planar MC into a micropillar. High Q values ($\sim 10^5$) have been demonstrated for large diameter III-V pillars, resulting in a large mode volume ($V > 50(\lambda/n)^3$), where $\lambda$ is the wavelength and n the refractive index, see e.g., Reitzenstein et al., Appl. Phys. Lett. 90, 251109 (2007). However, small values of V are crucial for applications in cavity quantum electrodynamics (cQED) since the light-matter coupling strength is proportional to $V^{-1/2}$ in this case. Small V can be achieved by reducing the pillar diameter. This, however, leads to significant reduction of Q due to side wall roughness and fabrication difficulties. Also, it is difficult to have single emitters located at the cavity antinodes in this case.

El Daif, et al. have proposed a MBE-grown III-V semiconductor (GaAs, AlGaAs, InGaAs) microcavity, see Appl. Phys. Lett. 88, 061105 (2006) and U.S. Pat. No. 7,729,043 B2. Before the deposition of the top DBR, one part of the cavity region is raised or recessed by using lithography and chemical etching. Such a raised portion essentially forms a square or rectangle pattern (side view). Because of the altered cavity length is determined by the region comprising the raised portions, light is also confined laterally in such cavities. However, it can be realized that the square-shaped pattern introduces significant light scattering, which in turn impacts the Q/V value (as to be discussed later in details). Also, the cavity length is changed within the spacer: the lithography/etching process required for achieving such structures is not compatible with many materials.

In general, "lithography" concerns processes for producing patterns of (essentially) two dimensional shapes, such as, for example, a resist coated on a semiconductor device. Conventional photolithography (optical lithography) is running into problems when the feature size is reduced, e.g. below 45 nm. These problems arise from fundamental issues such as sources for the short wavelength of light, photoresist collapse, lens system quality for short wavelength light and masks cost. To overcome such issues, alternative approaches have been explored.

Examples of alternative approaches are provided by nanolithography techniques, which can be seen as high resolution patterning of surfaces. More precisely, nanolithography refers to fabrication techniques of nanometer-scale structures. Depending on the actual technique used, patterns may be obtained which have one dimension between the size of an individual atom and approximately 100 nm (hence partly overlapping with photolithography). Such techniques further include charged-particle lithography (ion- or electron-beams), nanoimprint lithography and its variants, and scanning probe lithography (SPL) (for patterning at the nanometer-scale). SPL is for instance described in detail in Chemical Reviews, 1997, Volume 97 pages 1195 to 1230, "Nanometer-scale Surface Modification Using the Scanning Probe microscope: Progress since 1991", Nyffenegger et al. and the references cited therein.

In general, SPL is used to describe lithographic methods wherein a probe tip is moved across a surface to form a pattern. Scanning probe lithography makes use of scanning probe microscopy (SPM) techniques. SPM techniques rely on scanning a probe, e.g. a sharp tip, in close proximity with a sample surface whilst controlling interactions between the probe and surface. A confirming image of the sample surface can afterwards be obtained, typically using the same scanning probe in a raster scan of the sample. In the raster scan either the probe-surface interaction or the tip-surface distance controlled to keep the interaction constant is recorded as a function of position and images are produced as a two-dimensional grid of data points.

The lateral resolution achieved with SPM varies with the underlying technique: atomic resolution can be achieved in some cases. Use can be made of piezoelectric actuators to execute scanning motions with a precision and accuracy at any desired length scale, up to (or even better than) the atomic scale. The two main types of SPM are the scanning tunneling microscopy (STM) and the atomic force microscopy (AFM). In the following, acronyms STM/AFM may refer to either the microscopy technique or to the corresponding microscope itself.

In particular, the AFM is a device in which the topography of a sample is modified or sensed by a probe mounted on the end of a cantilever. As the sample is scanned, interactions between the probe and the sample surface cause pivotal deflection of the cantilever. The topography of the sample may thus be determined by detecting or controlling this deflection of the probe. Yet, by manipulating the tip-surface interaction, the surface topography may be modified to produce a pattern on the sample.

Following this idea, in a SPL device, a probe is scanned across a functional surface and brought to locally interact with the functional material. The most common approach relies on a local anodic oxidation of e.g., a silicon substrate using a conductive tip and a defined tip-sample voltage. In the presence of water, an oxide is formed beneath the tip which can be exploited for further patterning steps. Another approach is thermomechanical indentation, i.e., interaction with the probe causes material on the surface to be removed or deformed, shaped, etc. However, the use of SPL probes for nanopatterning applications is still under development.

SUMMARY

In an exemplary embodiment, a method of fabrication of a micro-optics device included providing a layer of material; patterning the layer of material by one or more of: locally unzipping and desorbing molecules thereof, with a nanoscale dimensioned probe, to obtain a curved surface for the layer of material, the curved surface having a curved profile in a plane section; and completing a layer structure perpendicular to the plane section by providing one or more additional layers of material in contact with the curved surface to obtain the micro-optics device, wherein the micro-optics device has the layer structure, with a given layer thereof comprising a defect delimited by two surfaces, wherein one of the two surfaces is the curved surface.

In another embodiment, a micro-optics device includes a layer of material patterned to have a curved surface, the curved surface having a curved profile in a plane section; and a layer structure perpendicular to the plane section, the layer structure comprising one or more additional layers of material in contact with the curved surface to define the micro-optics device, wherein the micro-optics device has the layer structure, with a given layer thereof comprising a defect delimited by two surfaces, wherein one of the two surfaces is the curved surface.

Methods and devices embodying the present invention will now be described, by way of non-limiting examples, and in reference to the accompanying drawings.

BRIEF DESCRIPTION OF THE SEVERAL VIEWS OF THE DRAWINGS

FIGS. 1(a)-1(c) are simplified representations (section views) of vertical microcavities. FIG. 1(a) is a view a typical prior art microcavity structure without lateral light confinement. FIG. 1(b) represents an ideal microcavity structure having raised portions for lateral light confinement. FIG. 1(c) illustrates a vertical microcavity with lateral light confinement comprising a curved defect, as obtained with methods according to embodiments of the invention;

FIGS. 2(a) and 2(b) are 3D views, schematically depicting curved (Gaussian) defects as provided in alternate embodiments;

FIGS. 3(a) and 3(b) reflect experimental profiles of defects, corresponding to the embodiment of FIG. 2(a);

FIGS. 4(a)-(c) show results obtained by simulating an electromagnetic wave confinement (x-component of the electric field E calculated in the (y, z) plane) in the device of FIGS. 1(a)-1(c), respectively.

FIGS. 11(a)-(c) depicts variants to FIG. 1(c).

DETAILED DESCRIPTION

Figure 5:
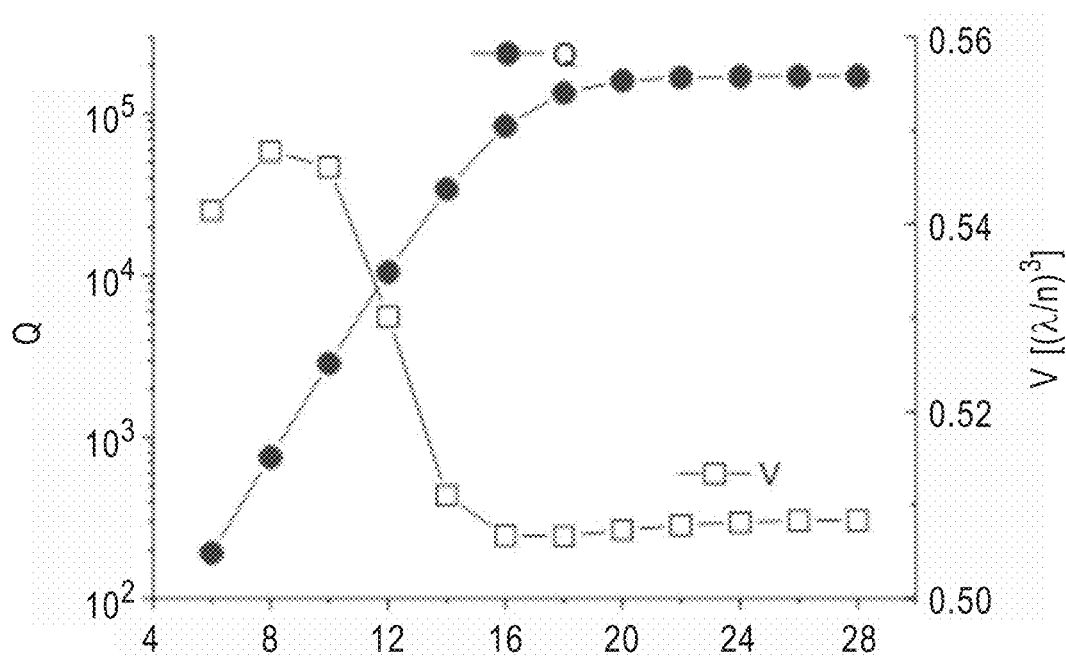
FIG. 5 is a graph showing various values for the cavity quality factor (Q) and the effective mode volume (V) according to an embodiment.

The present invention embodiments are directed to a method of fabrication of a micro-optics device, the method including: providing a layer of material; patterning the layer of material by locally unzipping and/or desorbing molecules thereof, with a nano-scale dimensioned probe, to obtain a curved surface for the layer of material, the curved surface having a curved profile in a plane section; and completing a layer structure perpendicular to the plane section by providing one or more additional layers of material in contact with the curved surface to obtain the micro-optics device, wherein the micro-optics device has the layer structure, with a given layer thereof comprising a defect delimited by two surfaces, wherein one of the two surfaces is the curved surface.

In embodiments, this method may comprise one or more of the following features: patterning comprises patterning the layer of material to obtain a curved surface having a curved profile in any plane section perpendicular to the layer structure; patterning comprises patterning the layer of material to obtain a curved profile that is essentially Gaussian in at least one plane section perpendicular to the layer structure, and wherein the curved surface obtained is essentially a bi-dimensional Gaussian function; the micro-optics device fabricated is a vertical microcavity and completing the layer structure is carried out to obtain a layer structure comprising: a first reflector and a second reflector, each comprising one or more material layers and being a Bragg reflector; and the given layer as a confinement layer between the first and second reflectors, wherein an electromagnetic wave can be substantially confined, wherein the confinement layer comprises a body and the defect, one of the two surfaces is contiguous with the body, the other one of the two surfaces being contiguous with a layer of the first or second reflector, and the curved profile has a vertex, which defines a maximal thickness $h_0$ of the defect between the two surfaces in the plane section, the maximal thickness $h_0$ being less than a thickness of the contiguous layer of the first or second reflector, and one of the two surfaces is contiguous with an upper surface of the body; and the other one of the two surfaces is contiguous with a lower surface of a lowest layer of the second reflector; the layer structure is completed to obtain N pairs of contiguous layers in one of the reflectors, which define 2N respective curved profiles, whose extrema are each aligned with an extremum of the curved profile of the curved surface, along the vertical axis z, wherein $N \geq 2$ and $N \geq 7$.

The layer structure is completed to obtain height shifts, respectively associated with the N pairs of contiguous layers, that are generally decreasing along the vertical axis z, with a maximal height shift associated to a pair of layers immediately contiguous with the defect of the confinement layer; patterning comprises patterning the layer of material to obtain a given curved profile of the curved surface that can be essentially described, along a direction x in a plane section perpendicular to the layer structure, by $f_{p,x}(x) = h_0(1-((x-\mu_x)^2/(2\sigma_x^2))$, to second-order series expansion in $(x-\mu_x)$, wherein: $h_0$ is the maximal thickness of the defect in the plane section considered; $\mu_x$ corresponds to the position of the vertex along direction x, in the considered plane section; and $\sigma_x$ is a characteristic length of extension of the given curved profile along direction x; $h_0$ is between 5 and 100 nm, or more specifically between 5 and 50 nm; and $\sigma_x$ is between 0.1 and 3 μm, or more specifically 0.3 and 1 μm; the layer of material provided comprises a polymer material, wherein a network of molecules are cross-linked via intermolecular, non essentially covalent bonds, whereby such molecules can desorb when patterning the polymer material with a heated, nano-scale dimensioned probe, and the step of patterning comprises patterning the layer of material by locally desorbing molecules thereof, with a heated nano-scale dimensioned probe; the layer of material provided comprises a polymer material, wherein an average molecular mass of the molecules is between 100 Da and 2000 Da, more specifically in the range from 150 Da to 1000 Da, and the molecules are cross-linked via hydrogen bonds; the layer of material provided comprises a polymer material having polymer chains able to unzip upon stimulation, and patterning comprises stimulating the layer of material via the nano-scale dimensioned probe for triggering an unzipping reaction of the polymer chains, and the polymer material provided comprises polymer chains for which an energetic or chemical modification event triggers the unzipping reaction and patterning includes stimulating the layer of material such that the energetic or chemical modification event occurs in at least one polymer chain of the polymer material.

The polymer material provided comprises poly(phthalaldehyde); the polymeric chains of the polymer material provided have essentially the same length; patterning the layer of material further comprises: locally desorbing or unzipping molecules of the layer of material with the nano-scale dimensioned probe to obtain a negative of the defect; and depositing into the negative a material to obtain the defect of the confinement layer; and patterning the layer of material comprises: locally desorbing or unzipping molecules of the layer of material with the nano-scale dimensioned probe to obtain the defect, the latter made of the same material as the layer of material provided.

The present embodiments provide new nanopatterning techniques to accurately pattern "defects" embedded in micro-optics devices such as microcavities. The defects can be given specific, accurate and smooth profiles (or shapes) that allow for enhancing interactions with electromagnetic waves, e.g., for electromagnetic wave confinement applications. In addition, embedded defects can now be provided with a well-controlled curvature near a vertex, e.g., a faithful Gaussian shape, giving rise to unprecedented confinement properties. Such curved defect shapes cannot be achieved with prior techniques such as evaporation or planar etching. The fabrication methods contemplated herein involve a modified SPL technique, wherein polymer chains are desorbed or unzipped at a fine grain level, to form well-controlled shapes. For instance, a negative (a mold) can be obtained, which can then be filled with a suitable material (e.g., by evaporation, sputtering, etc.) to obtain the desired defect shape. In variants, a "positive" is patterned directly. In each case, the desired defect shape can be obtained with unprecedented precision at this scale: the resolution achieved for typical defects as obtained with present techniques can be on the order of the nanometer.

Methods of fabrication as disclosed herein comprise patterning a layer of material by locally unzipping and/or desorbing molecules thereof, using a nano-scale dimensioned probe. A curved surface is obtained for the layer of material, i.e., the curved surface has a curved profile in a plane section perpendicular to the layer structure of the micro-optics device (or in any perpendicular plane section). The layer structure of the device is then completed by providing additional layers of material in contact with the curved surface previously obtained. A given layer of the layer structure comprises a defect, which is delimited by two surfaces. One of the surfaces is the curved surface. The other surface is typically contiguous with another material layer; it can be flat or curved as well, etc. The curved surface can advantageously be used for wave confinement or other types of wave-matter interaction. In that respect, the curved profile is Gaussian, i.e., it can for example be described by a bi-dimensional Gaussian function.

In the following, applications of the present fabrication methods are described in reference to vertical microcavities, for the sake of illustration. However, embodiments of the invention can be applied to a large class of micro-optics devices having a layer structure.

FIGS. 1(a)-1(c) are very simplified representations of vertical microcavities, as viewed from a section. FIG. 1(a) is a view a typical (and ideal) prior art microcavity structure, i.e., a micropillar.

FIG. 1(b) represents a microcavity structure having raised or recessed portions at the center. This structure is an ideal structure derived from the work of El Daif et al. (Appl. Phys. Lett. 88, 061105 (2006)), mentioned earlier, except that the single embedded InGaAs/GaAs quantum well is here not depicted. In addition, this ideal structure much differs from the shape as obtained in practice with prior art methods (because of the actual resolution). Thus, strictly speaking, FIG. 1(b) is not prior art.

FIG. 1(c) illustrates a vertical microcavity comprising a curved defect, as obtained with methods according to embodiments of the invention. In further detail, FIG. 1(c) shows a vertical microcavity 1, which has a layer structure, wherein layers are generally perpendicular to vertical axis z. The layer structure notably includes a first Bragg reflector 100 and a second Bragg reflector 200, each comprising material layers (111-131, 211-231), as usual in the art. This structure further comprises a confinement layer 10 separating the first 100 and second 200 Bragg reflectors. As usual too, this confinement layer is meant for confining therein an electromagnetic wave, typically in the visible to near-infrared light range.

Next, the confinement layer comprises a body 12, e.g., having essentially a rectangular section. Such a body compares to its counterpart in FIG. 1(a), its thickness along z being denoted by $h_b$. Yet, the confinement layer further includes a defect 20. Geometrically speaking, the defect 20 is delimited by: a first surface $s_1$, which as seen is perpendicular to the vertical axis z, and a second surface $s_2$, which is contiguous with a layer 211 of one of the Bragg reflector (i.e., reflector 100 in FIG. 1(c)).

As opposed to prior art devices, the defect is provided with a curved profile (see ref. 21, 21', 22 in FIG. 2(a) or (b)), in a plane section (e.g., (y, z)) perpendicular to the layer structure. For the time being, let's assume an ideal, i.e., a "perfect" curved profile. The role of imperfections (inherent to any fabrication process) will be discussed later in details. As we shall see, present fabrication processes allows for restricting imperfections to unprecedented levels, such that they are negligible, i.e., they do not adversely affect the performance of the cavity for typical emission wavelengths. The obtained profile has a vertex 25, which defines a maximal thickness $h_0$ of the defect, i.e., between the first surface $s_1$ and the second surface $s_2$, in the plane section considered, e.g., the plane (y, z). This vertex 25 could actually correspond to local or absolute extremum (minimum or maximum), as to be discussed later in reference to FIG. 11. This maximal thickness $h_0$ implies a height shift $h_0$, which adds to $h_b$ to yield a total, maximal thickness h for the confinement layer 10, in the plane section considered. Of course, the thickness $h_0$ of the defect as defined above depends on what section plane is actually considered.

For illustration purposes, we may typically consider the plane section perpendicular to the layer structure and passing through an absolute extremum of the defect, e.g., at the center of the cavity, such that vertex 25 actually corresponds to an absolute extremum. Still, the defect may present curved profiles in any other perpendicular plane sections. The maximal thickness $h_0$ (absolute or not) of the defect must be less than a thickness of the immediately contiguous layer 211, in any transverse plane, i.e., even when measured in a section plane for which the vertex 25 is an absolute extremum, for reasons to be discussed later.

The resulting curved profile allows for enhanced confining properties of the cavity, as present inventors have realized. More precisely, "curved profile" here means that the defect should exhibit a profile having at least one portion which is essentially curved (no spike, no straight angle), at the level of the vertex 25. Mathematically speaking, this means that the curved profile should essentially behave, e.g., along direction x in a plane section (x, z), as $$f_{p,x}(x)=h_0(1-((x-\mu_x)^2/(2\sigma_x^2))), \quad (3)$$

to second order of series expansion in $(x-\mu_x)$. Of course, this corresponds to an ideal case, free of imperfections. In Eq. (3), index "p" stands for "parabola", i.e., the function $f_{p,x}(x)$ describing the profile along a given in-plane direction x should look like a parabola in the vicinity of $x=\mu_x$.

More generally, it may be realized that any conic section-like curves would convene, as to be discussed later in reference to FIG. 11. In addition, and as to be explained in reference to FIG. 11 too, in more general cases, the defect is delimited by two surfaces, each generally perpendicular to the vertical axis z, wherein one of the surfaces is contiguous with the body (the other being contiguous with a layer of a Bragg reflector), and wherein one of the surfaces (not necessarily the upper surface contiguous with a Bragg reflector's layer) is curved, such as to exhibit a curved profile as described above.

In the above equation:

$h_0$ is the maximal thickness of the defect between $s_1$ and $s_2$, in the considered (perpendicular) plane section;

$\mu_x$ corresponds to the position of the vertex 25 on the x-axis, at which the defect presents a maximal thickness along z, in that same plane. Ideally, this point is a point of greatest curvature of the curved profile along the x-axis; and $\sigma_x$ is a characteristic length of extension of the given curved profile along the x-axis. In case of a Gaussian profile, $\sigma_x$ corresponds to the full width at half maximum (FWHM), divided by $2\sqrt{2\ln 2}$.

In this regard, the curved profile has a Gaussian shape, which allows for optimizing the wave confinement, as demonstrated by numerous simulations of the electric strength during elaboration of the present invention, i.e., $$f_g(x) = h_0 \exp[-(x-\mu_x)^2/(2\sigma_x^2)]. \quad (4)$$

Next, the second surface $s_2$ may have a curved profile in only one plane section, for example (y, z), i.e., the plane section depicted in FIGS. 1(a)-(c), when unidirectional confinement is desired (e.g., along x). This may be useful for many applications, as known per se.

However, where full 3D confinement is preferred, then the second surface $s_2$ may exhibit a curved profile in two or more plane sections, or in fact in any plane section perpendicular to the layer structure, e.g., (y, z), (x, z)).

Again, optimal confinement properties are obtained with a Gaussian profile, i.e., $$f_g(x,y) = h_0 \exp[-((x-\mu_x)^2/(2\sigma_x^2) + (y-\mu_y)^2/(2\sigma_y^2))]. \quad (5)$$

The function $f_g(x, y)$ describing the profile is now bi-directional, and has a maximum $h_0$ at $x=\mu_x$ and $y=\mu_y$. The values chosen for $\sigma_x$ and $\sigma_y$ are typically the same, whereby a radially symmetric profile is obtained, which may result in optimized confinement in some cases, e.g., depending on polarization.

The exact values of $h_0$ and $\sigma_x$, $\sigma_y$, shall depend on the desired emission wavelength and modal size; $\mu_x=\mu_y=0$ typically corresponds to the center in the plane section (x, y). Yet, for typical applications, one may choose: $h_0$ between 5 and 100 nm (if this structure is used in near-IR range), or more specifically 5 and 50 nm; and $\sigma_x$, $\sigma_y$ between 0.1 and 3 μm (each), or more specifically 0.3 and 1 μm, which ranges of values are in general not possible with other fabrication methods than those discussed below. Although E-beam lithography allows for reaching sub-10 nm range in terms of resolution, curved structures as contemplated herein cannot be achieved with good resolution at this scale with prior art techniques.

The case of a bi-directional Gaussian profile is illustrated in FIG. 2(a), where the envelope surface $s_2$ obeys Eq. (5). Curves 21, 22 denote Gaussian profiles as obtained along directions x and y, respectively. The curve 22' is a parabolic approximation to the profile along direction x, i.e., it corresponds to the second-order expansion of the corresponding Gaussian 22. Typically, the first Bragg reflector (not shown) is located under the other delimiting surface $s_1$, while the first layer (i.e., layer 211 in FIG. 1(c)) of the second Bragg reflector (not shown) would be contiguous with the surface $s_1$.

Experimental Results

A corresponding experimental image is given in FIG. 3(a). In fact, the latter depicts a Gaussian hole (i.e., a negative of the defect 20, as obtained before depositing defect material within the hole). More details shall be given in reference to FIGS. 8-10. FIG. 3(b) shows a profile of the defect 20 (full line), as obtained from along a given in-plane direction, e.g., along x. As seen, this profile is essentially Gaussian, subject to small deviations, due to the manufacturing process. Incidentally, this profile is not representative of the best possible profiles achievable with the present invention; on the contrary, this particular profile was retained because it allows one to "see" imperfections, which is otherwise not always possible at such a scale. As seen, the residual "noise" appears proportionally more important in regions where the profile takes lower values. Importantly, it should be kept in mind that the scales used for abscissa vs. ordinate differ, i.e., nanometers for the z-axis vs. micrometers for the x-axis. One accordingly realizes what level of accuracy is achievable in the context of the present invention embodiments.

FIG. 3(b) further shows the corresponding ideal Gaussian profile 21 (dashed line), Eq. (4), and the corresponding parabola (dotted line), Eq. (3), for comparison. The ideal Gaussian profile was obtained by fitting the theoretical Gaussian onto the experimental data. Obviously, other techniques such as Fourier-techniques could have been used to infer a corresponding Gaussian-like (or ideal) profile.

The inset focuses on the region above the "noise" level, denoted by double arrows in the main graphic. Beyond the experimental vs. perfect Gaussian profiles (full line and dashed line, respectively), the inset further shows variations of the absolute values of the relative differences between experimental and perfect Gaussian profiles, expressed in percents. This difference function, or $\Delta f(x)$, corresponds to $$\Delta f(x) = 100 |(f_{exp}(x) - f_g(x))/f_g(x)|. \quad (6)$$

As seen, $\Delta f(x)$ falls below 5% in the region of the half-maximum, in this example. The average value of $\Delta f(x)$ in this region is 3.54%. Considering instead the parabolic approximation (not shown in the inset), the mean value of $\Delta f(x)$ in that same region is now 4.17%, close to the former. More generally, the curvature of the experimental profile near $x=\mu_x$ should be such as to be well described by any well-behaved function developing as in Eq. (3), to second order in $(x-\mu_x)$. For instance, a Lorentzian (Cauchy-Lorentz distribution) profile would be convenient too, although the resulting confining properties are not expected to be as good as with a Gaussian profile.

Variant: Superimposed Disks

FIG. 2(b) corresponds to a variant of FIG. 2(a), where the Gaussian envelope is obtained by successively fabricating superimposed disks of decreasing diameter. The number of such disks is chosen such that the scattering induced by successive steps is negligible, i.e., the step height is chosen such as to remain small vis-à-vis the desired emission wavelength, e.g., less than 10% of the wavelength. In all cases, the step height is small compared to the total height of the structure. It may for instance be on the same level or smaller than the patterning precision, e.g., <1 nm.

The number of disks is for example larger or equal to nine, as in the example of FIG. 2(b). Yet, using five disks would already allow for rendering an inflexion point, like in a Gaussian profile. When using constant steps, it can be realized that the maximal deviation to the ideal external envelope ($s_2$) is on the order of $100 \times 1/N_D$ (expressed in percents), where $N_D$ is the number of disks. However, considering instead a mean Gaussian envelope (e.g., a best fit Gaussian) would roughly divide the maximal deviation by a factor 2.

Also, varying the dimension parameters pertaining to each disk allows to more closely approach a Gaussian profile, or more generally a profile having the desired effective curvature at the center. Thus, the minimal number of superimposed disks depends on the constraints used (number of disks, constant dimension parameters or not, desired emission wavelength, etc.).

In other embodiments, other shapes than disks may be used, i.e., square, rectangular, etc., still leading to some degree of confinement.

In all the cases tested, it has been found that best results are obtained when the mean value of $\Delta f(x)$ in the region of the half-maximum of the theoretical, ideal profile (i.e., profile 21 along surface $s_2$ in FIG. 2(b) or FIG. 2(a)) is less than 10%. This means that the relative deviation to an ideal curved profile (e.g., a Gaussian or any other well-behaved function curved at the level of the vertex) should fall under 10%, i.e., be less than 10% on average, in the region of the half-maximum of the defect 20. The same holds when considering a smooth pattern, like the one depicted in FIG. 2(a), yet subject to fabrication imperfections, as already evoked in reference to FIG. 3(b).

Redefining "Curved Profiles"

Thus, a "curved profile" as used herein means that the embedded defect 20 depicted notably in FIGS. 1(c), 2(a) and 2(b) exhibits, in a perpendicular plane section, an actual profile that does not substantially deviate from its ideal counterpart in an ideally curved surface (e.g., surface $s_2$) or function (e.g., a best-fit curved function $f_{best-Fit}(x)$ or $f_{best-Fit}(x, y)$, which develops as Eq. (3) or Eq. (3) below). More precisely, and as seen above, the average relative deviation to the ideal curved profile (absolute values) should be less than 10% in the half maximum region, notwithstanding fabrication imperfections or fabrication constraints used (e.g., disk shapes). Specifically, much improved optical properties will be obtained if this deviation falls under 5% on average, e.g., in case of a Gaussian envelope (see FIG. 3(b)). An ideally "curved surface" means an ideally curved external envelope such as surface $s_2$ in FIG. 2(a), or any best-fit or approximate surface function which develops as Eq. (3) (for 1D curved profiles) or as Eq. (3) below, for 2D curved profiles, namely:

$$f_p(x,y)=h_0(1-((x-\mu_x)^2/(2\sigma_x^2))-((y-\mu_y)^2/(2\sigma_y^2)))  \quad (7)$$

Referring back to the example of FIG. 1(c), note that in this example, the first delimiting surface $s_1$ is contiguous with an upper surface of the body 12, while the second delimiting surface $s_2$ is contiguous with a lower surface of a lowest layer 211 of the second Bragg reflector 200.

More generally (i.e., for more general micro-optics devices), one of the two delimiting surfaces $s_1$, $s_2$ shall be the curved surface as obtained according to present methods. Next, one of the two delimiting surfaces $s_1$, $s_2$ shall be contiguous with an upper surface of the body 12, while the other surface shall be contiguous with a surface of another layer of material.

Reverting to the example of FIG. 1(c), the contiguous pairs of upper layers 212-231 (reflector 200) have similar curved profiles, characterized by respective thicknesses (or shifts) $h_1, \ldots h_N$. The extrema of these profiles are each aligned with the extremum of the curved profile of the curved surface $s_2$. In this example, the shifts $h_1, \ldots h_N$ are all considered to be equal to $h_0$. This, however, is not necessarily the case in practice, as to be discussed later in reference to FIGS. 11(a)-(c). In addition, not all the layers of the reflector 200 need be curved. Strictly speaking, it suffices that the first layer 211, i.e., the layer immediately contiguous with the defect 20, be configured such as to "absorb" the convex curvature of the delimiting surface $s_2$. Which layers are curved and how much they are curved depends on embodiments to be discussed later in reference to FIGS. 5-7.

Simulation Results

At present, results as obtained from simulations will be described in reference to FIGS. 4-7. As evoked in the introduction, the software MEEP was used for the present simulations. FIGS. 4(a)-(c) illustrate results obtained by simulating an electromagnetic wave confinement in the (y, z) plane section, and for devices similar to the devices depicted in FIGS. 1(a)-1(c), respectively.

More precisely, the computation cell used was 8×5 $\mu m^2$; 13 pairs of dielectric layers, consisting of $Ta_2O_5$ (n=2.1) and $SiO_2$ (n=1.5), were considered for each of the Bragg reflectors, notwithstanding representations in FIGS. 1(a)-1(c). Speaking of boundary conditions, we added absorbing boundaries (as defined by perfectly matched layers in MEEP) around the structures. We put a point source at the center of the cavity and monitored the electromagnetic wave propagation. Signal processing on the fields at certain point were performed with the harminv package of MEEP to identify the frequencies and decay rates of the modes that were excited. The x-component of the calculated electric field strength is rendered in FIGS. 4(a)-(c), i.e., $E_x$, calculated for x=0, and various values of y, z. As seen in FIG. 4(a), a rectangular cavity (FIG. 1(a)) does not show any lateral confinement, as expected. FIG. 4(b): square-shaped defects (raised portions) provide lateral confinement but induce significant scattering at the corners, which adversely affects the cavity quality factor Q. On the contrary, a two-dimensional Gaussian-like defect nicely confines lights without notable scattering, FIG. 4(c). Note that the "volume" of the defect considered in FIG. 1(c)/FIG. 4(c), i.e., comprised under the Gaussian envelope $s_2$, is not the same as the volume of the recessed portions in FIG. 1(b)/FIG. 4(b). During the simulations, it was compared a square pattern and a Gaussian pattern having both the same height, say $h_0$, and the same width, say $\sigma_x$. Therefore, the enclosed area of the square is $h_0 \sigma_x$, while for the Gaussian is $h_0 \sigma_x \sqrt{2\pi}$.

Next, referring to FIG. 5, it can be appreciated that it is possible to reach Q values larger than $10^5$, while maintaining very small values of V (almost 10 times smaller than that of common micropillar cavities), by simply increasing the number N of pairs in each Bragg reflector (abscissa). In particular, choosing $N \geq 17$ allows reaching $Q>10^5$. Finally, Q values converge to a maximum, which is essentially attained for $N \geq 20$. According to these results, there is a priori no need to design devices comprising more than N=20 pairs in each Bragg reflector. This "maximum" number of pairs, however, depends on the refractive index contrast of the high and low index materials as well as the width of the Gaussian. The mode volume given in the figure, as mentioned before, is meaningful for the 2D simulation and does not compare directly to the reported values based on 3D simulation. Thus, what resorts from this example is that, for the given structure and materials considered, the mode volume converge to a minimum after $N \geq 20$.

Figure 7A:
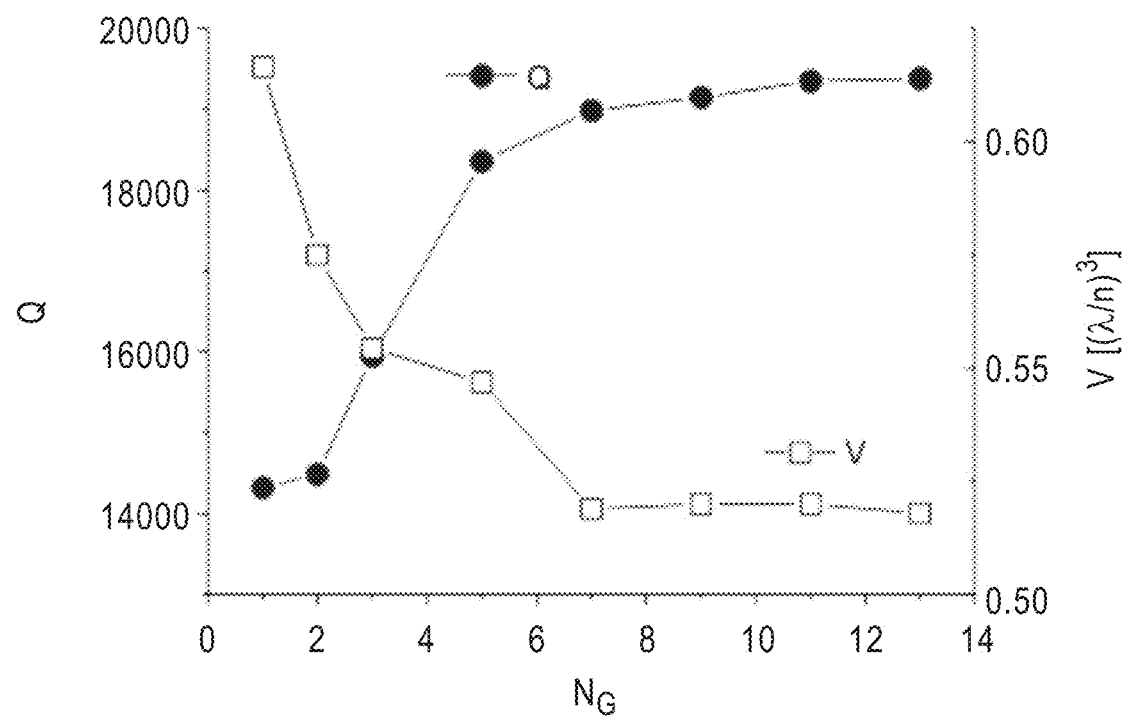

Referring now to FIGS. 7(a) and (b), here an embodiment similar to FIG. 1(c) is considered, wherein one of the reflector of the device 1, i.e., the upper reflector 200 in FIG. 1(c), comprises $N=N_G$ pairs of contiguous layers 211-231, i.e., associated to 2 $N_G$ curved profiles. Namely, each pair of contiguous layers 211-231 can be associated with a mean profile (e.g., along y). Not only the extrema of the 2 $N_G$ profiles are each aligned with the extremum of the defect 20, but also the height shifts $h_1, \ldots h_N$ are constant ($=h_0$) in this case, reflecting the height $h_0$ of the Gaussian defect 20. FIGS. 7(a) and (b) represent Q, V and the ratio Q/V vs. $N_G$. As seen, only the first few pairs of Gaussian-shaped layers play an appreciable role in the resulting light confinement properties. Considering only one curved pair already results in Q/V≈21 000, while using $N_G$=7 pairs (only) already suffices to bring this value close to its maximum, according to this example. Altogether, this means that the proposed structure is not highly sensitive to fabrication imperfections.

Figure 6:
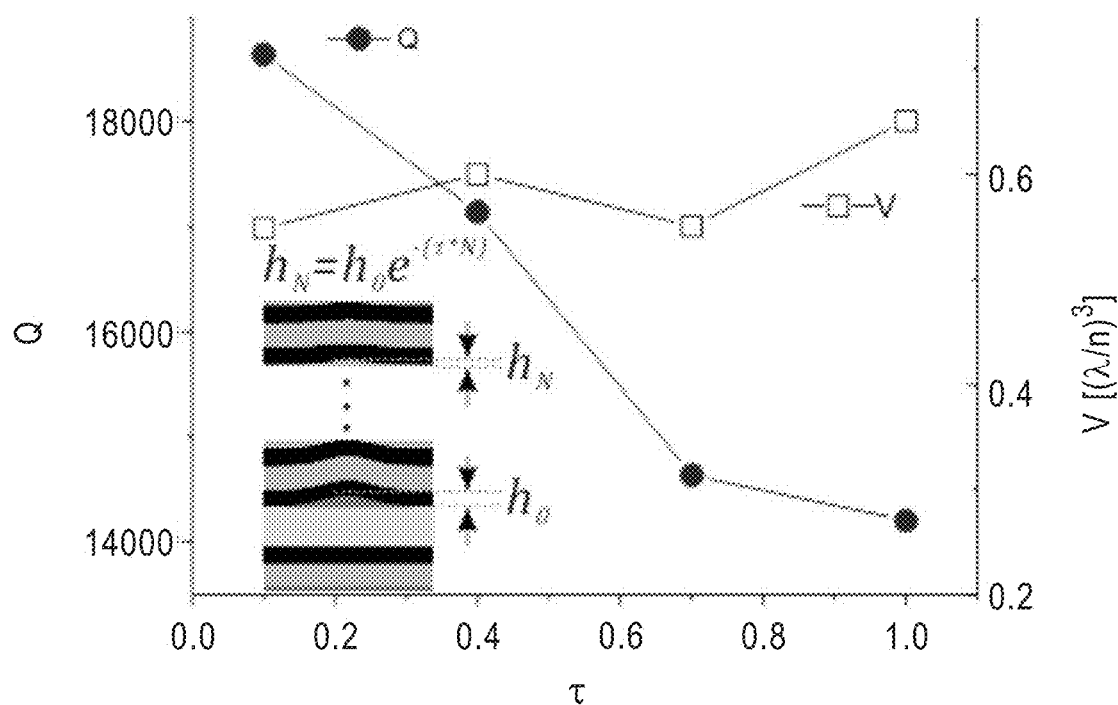
FIGS. 6-7 show various values for the cavity quality factor (Q) and the effective mode volume (V), as theoretically obtained in embodiments of the invention.
Figure 7B:
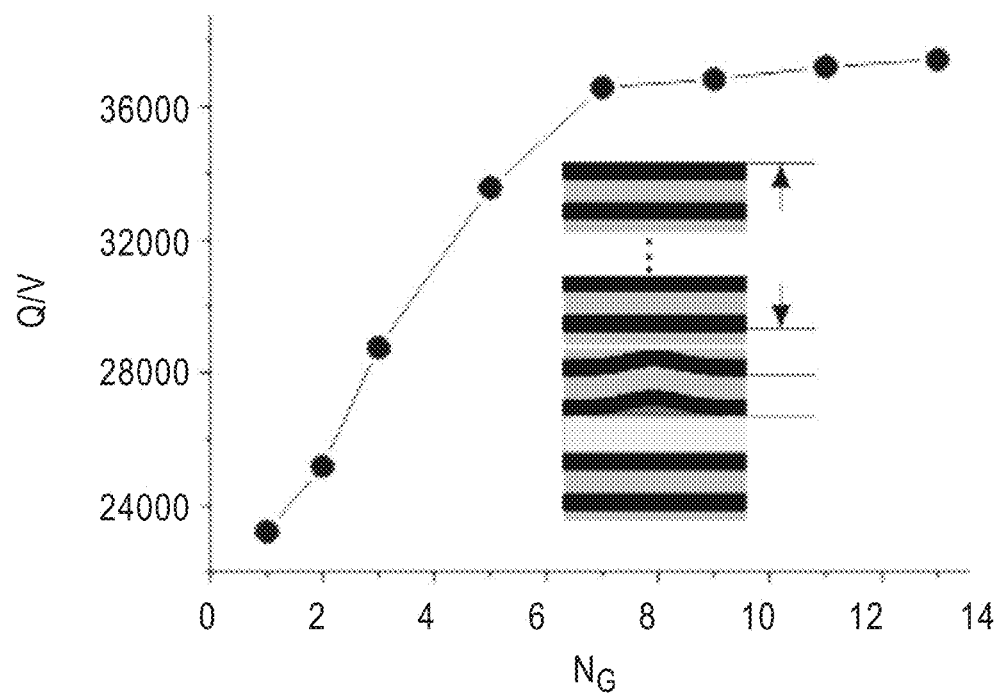

In this regard, and in reference to FIG. 6, the height shifts $h_1, \ldots h_N$, associated with the N pairs of contiguous layers in the upper reflector 200 may not be necessarily constant, contrary with the previous example. Indeed, they may be generally decreasing, i.e., along the vertical axis z, with the maximal shift $h_1$ pertaining to the pair of layers 211, 212 immediately contiguous with the curved defect 20 of the confinement layer. In fact, an exponential decay of the shifts is what would likely be obtained during deposition of the top layers 211-231. Yet, as seen in FIG. 6, this shall not critically affect the results inasmuch as the ratio Q/V remains appreciably high.

Figures 8A, 8B:
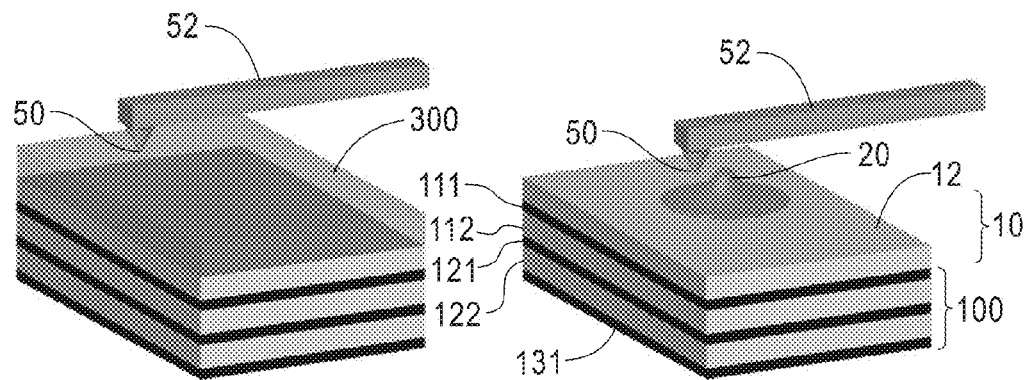
FIGS. 8-9 schematically illustrate steps of methods of fabrication of vertical microcavities according to embodiments.
Figure 9:
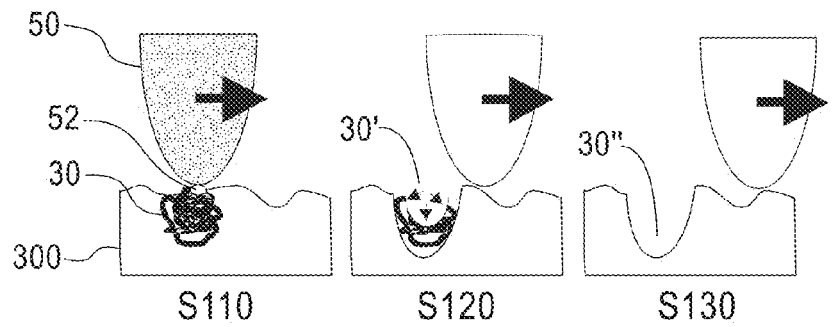

At present, detailed explanations about possible fabrication methods shall now be given, referring more particularly to FIGS. 8-10. Most generally, fabrication methods according to the present invention shall comprise the following essential steps:

First, a layer 300 of material is provided (step S110 in FIG. 9), possibly already deposited on top of another layer of material, e.g., a first Bragg reflector 100, FIG. 8(a);

Second, the layer 300 of material is then patterned by locally desorbing and/or unzipping molecules thereof, with a nano-scale dimensioned probe 50 (step S120-S130 in FIG. 9 or FIG. 8(b)), to obtain a curved surface for the layer of material. This curved surface has a curved profile (e.g., like profiles 21, 21', 22 in FIGS. 2-3) in at least a plane section (e.g., (y, z), (x, z) in FIGS. 2-3). Thus, a defect 20 as described earlier for a confinement layer is obtained; and Third, additional layers 211-231 of material are provided, i.e., adjoined in contact with the patterned layer, e.g., deposited by sputtering or evaporation, as necessary, to complete the layer structure of the micro-optics device.

Figures 10A, 10B:
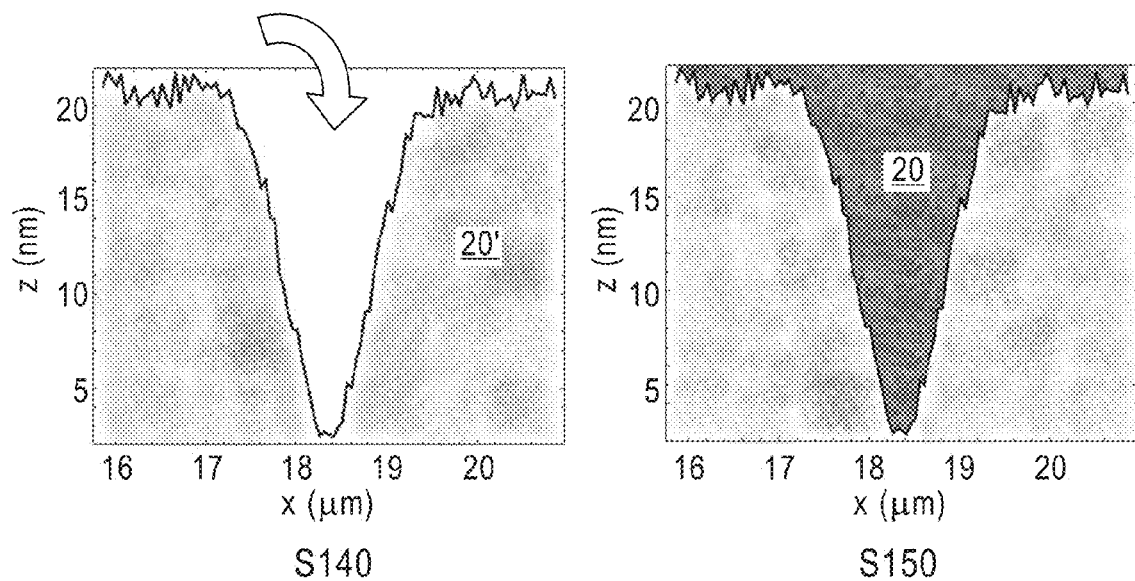
FIGS. 10(a)-(b) depicts additional steps involved in a method of fabrication of microcavities, in embodiments.

Thanks to the above patterning process (molecules are locally unzipped and/or desorbed), the resolution achievable for the optical defect 20 is remarkably improved, as illustrated in FIG. 3(b) or 10(b). Importantly, no thermomechanical indentation is necessary.

At this point, two main methods can be contemplated.

Direct Patterning

A first one consists of patterning the defect 20 "directly". This is illustrated in FIGS. 8(a)-(b). Namely, here, patterning the working layer 300 typically involves locally desorbing or unzipping molecules of the layer 300, with the nano-probe 50, to obtain the desired defect shape 20. The nano-probe can be a typical SPL nano-probe, ideally terminated by a single atom, as known from SPL. Yet, the probe should be suitably designed for the present purpose, e.g., connected to an electrical circuit allowing for heating the probe during a controlled time and at a controlled temperature.

For applications to vertical microcavities such as discussed above, the material of the layer 300 is chosen in accordance with materials 111, 112 contemplated for the Bragg reflectors 100, 200, as well as in accordance with the material of the body 12, in order to obtain the desired Bragg interferences.

"Negative" Approaches

Another class of methods consists of fabricating first a "negative" of the defect 20, which offers much more possibilities in the choice of material for the defect 20. In such fabrication methods, patterning the layer 300 of material comprises:

Locally desorbing or unzipping molecules 30, e.g., polymer chains, of the layer 300, e.g., with a nano-probe, to obtain a negative 20' of the defect 20, i.e., a hole or cavity correspondingly shaped (step S110-130 in FIG. 9); and then Depositing, and notably into the negative 20', a material 20, which, again, can be chosen in accordance with materials in the Bragg reflectors 100, 200 and the body 12, to obtain the defect 20 of the confinement layer 10. This is illustrated by steps S140-S150, in FIG. 10.

The residual material in 20' is easily removed next, if necessary, owing to the decomposable material used for the negative. In case the residual material in 20' is removed, further layers of material can be deposited next to complete the cavity.

The material filled can for instance be the same as the body 12 or another "gain" material (for example, light emitting organic dyes). The choice of material for the body 20 depends also on whether the body 20' is finally removed or not.

Materials

Molecules Cross-Linked Via Intermolecular Bonds

In this regard, the layer 300 of material used, be it for the negative 20' or for direct patterning of the defect 20, may comprise a polymer material, wherein a network of molecules are cross-linked via intermolecular, non essentially covalent bonds. Such molecules can conveniently desorb when patterning the polymer material with a heated nano-probe 50. Also, an average molecular mass of the molecules is advantageously between 100 Da and 2000 Da, more specifically in the range from 150 Da to 1000 Da, which offers enhanced desorbing properties.

In more detail, the layer 300, i.e., a film, is provided which comprises the network of molecules, i.e., cross-linked via intermolecular bonds, such as van der Waals forces or Hydrogen bonds. Such bonds are not of a covalent bonding nature (at least not essentially), that is, there is no clear electron pairing between radicals that characterize the ordinary Heitler-London covalent bond. Rather, the interaction energy of intermolecular bonds considered here stake can be divided into various physically meaningful components such as electrostatic, exchange, dispersion, relaxation, etc. Yet, none of these components can clearly be called "covalent", i.e., anti-bonding mixing of orbitals is likely involved, rather than bonding mixing. Should substantial charge-transfer be involved and be regarded as a coordinate-covalent interaction, the occurrence of a substantial overlap repulsion (the exchange component) would not make the molecules be viewed as covalently bonded.

Intermolecular bonds provide a better compromise for present applications than the usual chemical bonds, inasmuch as the film can remain stable under normal conditions, less energy being yet required at the probe to create the patterns.

In this regard, patterning the film is carried out by means of a nano-scale dimensioned probe, which is further heated, such as to desorb molecules when interacting with (e.g., urged against) the film. In other words, molecules evaporate upon interaction with the probe. The probe thereby directly engraves patterns into the film. Both the temperature of the probe and the time of exposure of the probe to the surface can be adjusted according to a characteristic of the cross-linked molecules, in order to achieve desired desorption performances. The average desorption energy of the molecules can be seen as such a characteristic, which is necessarily governed by the intermolecular bonds involved. Since the binding energy caused by intermolecular links is small (at least compared to covalent links), the process can work at moderate temperatures and short probe-sample interaction times. This, in turns, allows for scaling to fast writing times.

The probe 50 used is typically an AFM nano-probe mounted on the end of a cantilever 52, as schematically represented in FIG. 8. More details are provided in the next section (unzipping polymer materials).

When the probe, suitably heated, is urged against the surface of the film 300, and interacts therewith, the interaction is likely to desorb one or more molecules. The probe temperature $T_p$ and the time $t_e$ of exposure of the probe to the surface are suitably adjusted, such as to optimize desorption of molecules. Incidentally, a person skilled in the art may appreciate that, for a given load force, the above parameters ($T_p$, $t_e$) determine the desorption process, inasmuch as its rate constant roughly obeys, in a simple physical picture, the law r=A exp($-E_a/k_BT$), where A is the "attempt frequency", that is, the chance of a molecule to overcome its potential barrier to desorption, which is partly determined by the exposure time, and $E_a$ is the activation energy of desorption of the cross-linked molecules, $k_B$ is Boltzmann's constant, and T is the temperature.

In addition, the skilled person may appreciate that the force applied to the probe while patterning may suitably be adapted in respect of the sample. Basically, in a preferred embodiment, both temperature and force pulses are applied to the probe, at positions where the molecules are to be removed. Obviously, an assembly of molecules is likely to be desorbed by the probe, during a single exposure, that is, a single indent step. Importantly, molecules are desorbed, that is, evaporated by the heated probe, instead of thermo-mechanically indenting or locally melting the film. Next, short after (or even before) actual molecule desorption, the probe is released to a non-patterning position. An advantage of evaporation is that evaporated material is completely removed from the sample and not only pushed aside, as opposite to an elastic deformation were rims are formed at the edges of the pattern, or the density is locally increased.

In order to create a 3D pattern such as a Gaussian hole, one may proceed be desorbing "pixel"-by-"pixel", or layer-by-layer, e.g., to create a hole within a hole (or a smaller disk on top of a larger disk). In other words, repeated exposures may be carried out. Alternatively, direct 3D-patterning in a single exposure step can be attained by adjusting an evaporation volume at the location on the surface that is exposed. For example, one may contemplate modulating e.g. the force applied to the probe during an exposure, e.g. using electrostatic actuations. Varying the force applied during an exposure results in a pattern with modulated depth. Similarly, direct 3D-patterning can further be controlled by varying the temperature of exposure (using e.g. an integrated heater in the probe tip), or the exposure time. Accordingly, a continuous change of topography can be carried out. This way, a 3D pattern can be obtained within a single exposure, i.e., a single indent step. Incidentally, one may vary any of the above parameters (force, temperature, exposure time) or a combination thereof. In addition, before the proper patterning steps, one may calibrate the depth of indents as a function of applied load and temperature, so as to set optimal working conditions.

For example, for a patterning depth of around 4 nm, a temperature of 300° C. and a load force of 80 nN may be optimal (especially for films as described below). Within such conditions, writing indents with a pitch of 10 nm typically yields uniform removal of material over large areas. This results in patterned areas with distinct patterning depths. More generally, load forces of 5-100 nN can be contemplated. Furthermore, the ability to image the surface prior to patterning enables very accurate positioning. This becomes important notably when it comes to pattern very fine features at high resolution. Once the pattern is written, it is possible to image it before further processing steps. A post-imaging allows for quality control of the written pattern and its eventual correction.

At present, variants as to the types of suitable polymers are discussed.

First, the average molecular mass of molecules composing the film is less than 4000 dalton (Da), in order to enable a desorption process. Yet, tests have shown that molecular masses in the range from 100 Da to 2000 Da make the process easier. Even, it has been realized that masses in the range from 150 Da to 1000 Da allow for optimal desorption, at least for the sample studied in the context of the invention.

As described earlier, molecules are cross-linked via, e.g., hydrogen bonds. A hydrogen bond is typically defined as the attractive force occurring between a hydrogen atom attached to an electronegative atom of first molecule and an electronegative atom of a second molecule. A typical covalent (bonding) bond is twenty times stronger than a typical hydrogen bond. Accordingly, relatively low desorption temperature and short interaction times can be contemplated in practice.

The average desorption energy of the molecules is comprised in the range from 2 eV to 3 eV, as the result of various intermolecular links in the media (including long-distance interactions). More generally, desorption energies between 1 and 4 eV may be convenient. Closely related, the temperature of the heated probe is typically between 300° C. and 600° C. It is more specifically between 300° C. and 500° C., which turned out to be optimal in most cases studied. Incidentally, the temperature of the probe is believed to be about twice as much as the temperature of the desorbing molecules. Meanwhile exposure times are typically in the range of 1 microsecond (μs) and 10 μs. Yet, it was possible to set the exposure time to 0.3 μs, with acceptable results.

Next, the network of molecules forming the film may advantageously comprise molecular glasses. An example of suitable molecular glass is a phenolic compound, which consists of small molecules (with molecular masses typically of about 1000 Da). Interestingly, such compounds cannot properly crystallize due to a large number of configurations with merely equivalent conformational energy. At the periphery of the molecules, hydrogen bonding groups (Hydroxyl) establish the physical links between the molecules.

Due to the high number of hydrogen bonding interactions, the polymer exhibits a relative high glass transition temperature, or $T_g$. In short, below the temperature $T_g$, the structure of the polymer can be termed glassy, as it has a merely random arrangement of chains, similar to molecular arrangements seen in glasses. Here, $T_g$ is of about 120° C., which is much suited for use in patterning. More generally, the glass transition temperature is advantageously set between 80° C. to 160° C., and more specifically between 100° C. and 130° C., wherein it was shown to be more suited for patterning in practice. Furthermore, hydrogen bonds make the material stable against repeated scanning with the probe.

A proof of concept has been successfully performed by using a substrate prepared as already mentioned. With typical writing conditions, patterns have been structured onto the polymer media. Specifically, the patterned surface at stake is made of a network of molecular glass molecules, cross-linked via hydrogen bonds. A load force of about 80 nN was used to indent the patterns, together with a probe temperature of nearly 400° C. The surface image was then obtained with the same AFM probe as used to pattern.

Unzipping Polymer Materials

In variants, the polymer material may comprise polymer chains, which are able to unzip upon suitable stimulation (energetic or chemical modification event, protonation, etc.). There, the patterning steps further comprise stimulating the layer 300 of material via the nano-probe for triggering an unzipping reaction of the polymer chains.

The polymer material provided comprises polymer chains for which an energetic or chemical modification event triggers the unzipping reaction. Typically, stimulating a first chemical modification or degradation event triggers an unzipping effect, partial or total. Thus, patterning steps need to include proper stimulation, typically by heating the layer 300 of material via the probe 50, such that a suitable modification event occurs in a polymer chain of the polymer material. Again, the probe should be accordingly designed, e.g., connected to an electrical circuit allowing for heating the probe during a controlled time and at a controlled temperature. Other stimulation can yet be contemplated.

The polymer material comprises poly(phthalaldehydes). Polymeric chains thereof may have substantially the same length, a thing that may be important in some cases, notably for reasons of reproducibility. An organocatalytic approach to the polymerization of phthalaldehyde is preferred, e.g., using dimeric 1-tert-butyl-2,2,4,4,4-pentakis(dimethylamino)-$2\Lambda^5,4\Lambda^5$-catenadi(phosphazene) ($P_2$-t-Bu) phosphazene base as an anionic catalysts in presence of an alcoholic initiator. For example, a resulting polymer (comprising ~200 monomer units equivalent to a molecular weight of 27 kDa) possess a low ceiling temperature and further facilitate the ability to create permanent patterns by selective thermolysis, using a heated probe.

In more detail, with such materials and techniques, deep patterns can be written with virtually no or small indentation force applied to the probe tip. This minimizes pattern distortion resulting from indenting or displacing the material.

Furthermore, polymeric chains can be made of arbitrary length which offers substantial flexibility in tuning the material properties such as the glass temperature and solvent resistance. An additional advantage is that no fine-tuning of intermolecular forces is required, at variance with materials requiring stabilization from secondary structure such as hydrogen bonds. For example, preferred polymer films as contemplated here are not susceptible to water and solvent uptake, which may result in deteriorating the patterning properties. A variety of methods can furthermore be implemented for the activation of the intentional decomposition of such materials. For example, they can be thermally activated directly by the probe (energetic modification event). Alternatively, a chemical stimulus, e.g. a free proton from an acid generator included in the polymeric network, may serve this purpose.

More details are now discussed in reference to FIG. 9. A material 300 is provided, which consists of a polymer film on a substrate (not shown, that could be the confinement layer body 12 of FIG. 1 or 8. The polymer film comprises polymer chains 30. In FIG. 9, only one such chain 30 is depicted, for illustration. The probe 50 is typically a SPM (e.g. AFM) probe mounted on the end of a cantilever 52. The probe may thus be part of an AFM device (not shown), comprising electronic circuitry suitably designed to measure and control, in operation, an interaction between the probe 50 and a sample surface. Engineering solutions, which are known per se, may further be provided such that it is possible to accurately control the relative position of the probe and surface, and possibly to ensure good vibrational isolation of the SPM. This can for instance be achieved using sensitive piezoelectric positioning devices, as known in the art. Both vertical and horizontal controls of the probe are thus typically provided together with the SPM. In a usual SPM device, the probe 50 is raster scanned above the sample surface, such that imaging of the surface topology can be carried out. Here, the probe is used primarily to engrave 3D patterns on the surface of the polymer film 300.

How the surface is patterned can be decomposed into several substeps. Before patterning occurs properly, the probe 50 is maintained in a "non-patterning position", that is, close to the surface of the film (not depicted). The probe is not yet in close enough contact to enable surface patterning. A first substep 110 may consist of stimulating the film e.g., directly with the probe. Here, energy sufficient for the polymer to unzip is provided to the film, via an energetic modification event 52. In particular, the polymer can be chosen such that the energy provided suffices to break one bond of one or more polymer chains 30, as depicted in FIG. 9, step 110. In practice, the probe is put in close proximity to or in direct contact with the surface of the film while being suitably heated. The force and the time of the exposure are tuned according to the polymer used in the film and the desired patterns.

As said, the polymer chains are able to unzip upon suitable stimulation, e.g., via an energetic or a chemical modification event. Such an event may for instance result in breaking a single chemical bond of the chain, which in turn triggers the unzipping reaction. This contrasts with polymers (e.g., polystyrene, poly-α-styrene) which would unzip if the polymer chain has enough thermal energy to decompose. Here, one broken bond suffices to trigger the unzipping effect. As the latter is self-sustained, less energy needs to be provided for the polymer to unzip during the patterning process.

The above principles are illustrated in steps 120 and 130 of FIG. 9. At step 120, degradation of a given polymer chain 30' begins. At step 130, the polymer chain 30" is entirely degraded, e.g. into volatiles such as monomers. In other words, the polymer chain that was previously stimulated (step 110) has now disappeared. A clean patterned surface is accordingly obtained. Tests have most successfully be implemented with a poly(phthalaldehyde) having a molecular weight of approximately 27 kDa, corresponding to ~200 monomer units per molecule. As the obtained polymer is thermodynamically unstable at room temperature, the energetic cost of the patterning process is very much affordable.

The AFM device used has the following characteristics:

A (low) applied force, typically less than 2±1 nN is sufficient to make conformal contact with the polymer surface;

The indenter tip used has an apex radius of ~5 nm.

The characteristics of the cantilever mount of the indenter are as follows:

the spring constant is 1 N/m and the resonance frequency is 150 kHz.

The tip heater is heated to 650° C. or higher and the load force varied between 0 and 20 nN. The force required to reach a certain depth can be approximated by F=k d, where k is the spring constant (here ~1 N/m) and d is the depth (0-20 nm). The duration of the heat and force pulses is typically 5-20 μs. Deeper voids can be written by increasing the load force, to ensure that the load on the tip is always above the threshold force as the indenter sinks deeper into the polymer in the process of writing. A curved profile can thereby be achieved.

The curved profile is for example approximated by bitmap using 256 height values and pixel positions with a distance of 10-20 nm.

The clean removal of material that results at low applied forces indicates an effective triggering of the unzipping process of the polymer due to the contact with the hot tip. The resulting monomer constituents are effectively removed from the substrate, i.e. sufficiently heated by the tip to be evaporated.

Final Considerations

While the present invention has been described with reference to certain embodiments, it will be understood by those skilled in the art that various changes may be made and equivalents may be substituted without departing from the scope of the present invention. In addition, many modifications may be made to adapt a particular situation to the teachings of the present invention without departing from its scope.

Therefore, it is intended that the present invention not be limited to the particular embodiment disclosed, but that the present invention will include all embodiments falling within the scope of the appended claims. For example, as illustrated in FIG. 1(c), methods as described above may be implemented such as to obtain a first delimiting surface $s_1$ that typically is not curved and contiguous with an upper surface of the body 12, while the second delimiting surface $s_2$ is typically curved and contiguous with a lower surface of another layer, e.g., a lowest layer of a second Bragg reflector. However other designs can be contemplated, as illustrated in FIGS. 11(a)-(c), which depict variants to FIG. 1(c). In particular, as seen in FIG. 11(b) or FIG. 11(c), the lower delimiting surface, i.e., contiguous with an upper surface of the body 12, can be the curved surface, while the other (upper) delimiting surface is not curved, but is contiguous with a lower surface of another layer, e.g., a lowest layer of a Bragg reflector. According to these examples, it can be understood that the confinement layer most generally comprises a body 12 and a defect 20, wherein the defect is delimited by two surfaces, i.e., a first and a second surfaces, each generally parallel to the layer structure (i.e., perpendicular to the vertical axis z). One of the surfaces is contiguous with the body (the other being contiguous with any other layer, e.g., a layer of a Bragg reflector), and one of the surfaces (not necessarily the upper surface) is curved, such as to exhibit a curved profile as described earlier, i.e., in at least a plane section perpendicular to the layer structure. For applications to vertical microcavities, the curved profile has a vertex, which defines a maximal thickness $h_0$ of the defect between the first and second surfaces, in the plane section, wherein the maximal thickness $h_0$ is less than a thickness of a layer contiguous with the defect. With certain designs and careful choice of materials, light confinement can still be achieved, and notably in devices such as depicted in FIG. 11(b) or FIG. 11(c). FIG. 11(b) and FIG. 11(c) are just possible variants (not necessarily preferred or more efficient in terms of light confinement).

Also, as seen in FIGS. 11(a)-(c), two defects 20, 20a (or more) may be provided. In the case of FIG. 11(c), it can be appreciated that the profile of the two defects 20, 20a describes hyperbola in the vicinity of the vertices. It could also be described as two parabolas, whose vertices face each other. In the case of FIG. 11(a), the profile of the two defects 20, 20a could still be described as parabola, but this time inverted compared with FIG. 11(c). More generally, the profile of a defect 20, 20a in one (perpendicular) plane section could resemble a conic section. Similarly, the one or more defects 20, 20a provided could have any curved portion, e.g., cylindrical, hemispherical or partially spherical curved surface, parabolic surface, central slotted Gaussian, dome, cone, concave hole, etc.

More generally, present nano-writing techniques are capable of creating advanced 3D structures other than simple square patterns (which in practice had "chaotic" surfaces so far), such as Gaussian dome, cone, concaved hole, etc. As evoked earlier, a Gaussian shaped defect is however preferred; it may induce more than 10 times higher value of Q/V, and allow for Q/V values better than that of most micropillar cavities. Such techniques would further enable very small mode volume e.g., smaller than $(\lambda/n)^3$. Also, as said earlier, present fabrication methods offer some tolerance against fabrication imperfections. Importantly, there is no need of lithography and dry/wet etching. The resulting devices are furthermore highly compatible with optoelectronic devices utilizing vertical microcavities or the like, such as VCSELs. In addition, they make it possible to provide electrical contacts (with typical VCSEL fabrication techniques) and to easily incorporate gain layer. Light emitting characteristics are similar to micropillars'; the light can be coupled to optical fiber with high efficiency.

Suitable materials for the reflectors can be chosen from the following list: Semiconductors (Si, GaAs, GaN, InP, InGaN, etc.), metals (Silver, etc.), oxides ($SiO_2$, $TiO_2$, $Ta_2O_5$, $HfO_2$, $Al_2O_3$, $LiNbO_3$, $BaTiO_3$ etc.) or nitrides ($Si_3N_4$, SiON, TiON, . . . ). Suitable materials for the embedded defects are: semiconductor (same as above); oxides (same as above), nitrides (same as above), polymers, etc., or any material which essentially is transparent for the wavelength of interest. Such material can be the same as or different from the body 12 (e.g., spacer, gain layer).

The confinement layer body can be made of a low index material, e.g., polymers, organics, nanocrystals, metal nanoparticles, etc.

As said, for applications to vertical microcavities the typical vertical size of the defects is smaller than the thickness of the first layer (of the reflector) that is deposited afterwards. Also, in practice, a typical lateral size of the defect is larger than half of the wavelength of interest and less than 10 times the wavelength so that the structure will not evolve into a conventional planar cavity without lateral confinement.

Finally, although applications of the present invention has been described essentially in respect of Bragg reflectors), cavities with other types of reflectors (e.g., metallic layer reflectors or grating-based reflectors) may also advantageously benefit from this invention. This notably applies to metal mirrors made of Al, Ag, Au, etc. and high contrast grating reflectors made of semiconductors. More generally though, present fabrication methods apply to a range of micro-optics devices, i.e., having a layer structure with embedded curved defects.

The invention claimed is:

1. A method of fabrication of a micro-optics device, the method comprising:
   providing a layer of material;
   patterning the layer of material by one or more of: locally unzipping and desorbing molecules thereof, with a nano-scale dimensioned probe, to obtain a curved surface for the layer of material, the curved surface having a curved profile in a plane section; and
   completing a layer structure perpendicular to the plane section by providing one or more additional layers of material in contact with the curved surface to obtain the micro-optics device, wherein the micro-optics device has the layer structure, with a given layer thereof comprising a defect delimited by two surfaces, wherein one of the two surfaces is the curved surface.

2. The method of claim 1, wherein patterning comprises patterning the layer of material to obtain a curved surface having a curved profile in any plane section perpendicular to the layer structure.

3. The method of claim 2, wherein patterning comprises patterning the layer of material to obtain a curved profile that is essentially Gaussian in at least one plane section perpendicular to the layer structure, and wherein the curved surface obtained is essentially a bi-dimensional Gaussian function.

4. The method of claim 1, wherein the micro-optics device fabricated is a vertical microcavity and wherein completing the layer structure is carried out to obtain a layer structure comprising:
a first reflector and a second reflector, each comprising one or more material layers and being a Bragg reflector;
the given layer as a confinement layer between the first and second reflectors, wherein an electromagnetic wave can be substantially confined, and wherein the confinement layer comprises a body and the defect, wherein, one of the two surfaces is contiguous with the body, the other one of the two surfaces being contiguous with a layer of the first or second reflector;
wherein the curved profile has a vertex, which defines a maximal thickness h0 of the defect between the two surfaces in the plane section, the maximal thickness h0 being less than a thickness of the contiguous layer of the first or second reflector, and wherein one of the two surfaces is contiguous with an upper surface of the body; and
the other one of the two surfaces is contiguous with a lower surface of a lowest layer of the second reflector.

5. The method of claim 4, wherein the layer structure is completed to obtain N pairs of contiguous layers in one of the reflectors, which define 2N respective curved profiles, whose extrema are each aligned with an extremum of the curved profile of the curved surface, along the vertical axis z, wherein N≥2.

6. The method of claim 5, wherein N≥7.

7. The method of claim 6, wherein the layer structure is completed to obtain height shifts, respectively associated with the N pairs of contiguous layers, that are generally decreasing along the vertical axis z, with a maximal height shift associated to a pair of layers immediately contiguous with the defect of the confinement layer.

8. The method of claim 1, wherein patterning comprises patterning the layer of material to obtain a given curved profile of the curved surface that can be essentially described, along a direction x in a plane section (x, z) perpendicular to the layer structure, by $f_{p,x}(x)=h_0(1-((x-\mu_x)^2/(2\sigma_x^2))$, to second-order series expansion in $(x-\mu_x)$, and wherein:
$h_0$ is the maximal thickness of the defect in the plane section considered;
$\mu_x$ corresponds to the position of the vertex along direction x, in the considered plane section; and
$\sigma_x$ is a characteristic length of extension of the given curved profile along direction x.

9. The method of claim 8, wherein:
$h_0$ is between 5 and 100 nm; and
$\sigma_x$ is between 0.1 and 3 μm.

10. The method of claim 9, wherein the layer of material provided comprises a polymer material having polymer chains able to unzip upon stimulation, and wherein patterning comprises stimulating the layer of material via the nano-scale dimensioned probe for triggering an unzipping reaction of the polymer chains, and wherein the polymer material provided comprises polymer chains for which an energetic or chemical modification event triggers the unzipping reaction and patterning includes stimulating the layer of material such that the energetic or chemical modification event occurs in at least one polymer chain of the polymer material.

11. The method of claim 10, wherein the polymer material provided comprises poly(phthalaldehyde).

12. The method of claim 11, wherein the polymeric chains of the polymer material provided have essentially the same length.

13. The method of claim 8, wherein:
$h_0$ is between 5 and 50 nm; and
$\sigma_x$ is between 0.3 and 1 μm.

14. The method of claim 1, wherein the layer of material provided comprises a polymer material, wherein a network of molecules are cross-linked via intermolecular, non essentially covalent bonds, wherein such molecules can desorb when patterning the polymer material with a heated, nano-scale dimensioned probe, and wherein the step of patterning comprises patterning the layer of material by locally desorbing molecules thereof, with a heated nano-scale dimensioned probe.

15. The method of claim 14, wherein the layer of material provided comprises a polymer material, wherein an average molecular mass of the molecules is between 100 Da and 2000 Da, and wherein the molecules are more specifically cross-linked via hydrogen bonds.

16. The method of claim 15, wherein the average molecular mass of the molecules is between 150 Da to 1000 Da.

17. The method of claim 1, wherein patterning the layer of material further comprises:
locally desorbing or unzipping molecules of the layer of material with the nano-scale dimensioned probe to obtain a negative of the defect; and
depositing into the negative a material to obtain the defect of the confinement layer.

18. The method of claim 1, wherein patterning the layer of material comprises:
locally desorbing or unzipping molecules of the layer of material provided with the nano-scale dimensioned probe to obtain the defect, the latter made of the same material as the layer of material provided.

* * * * *